(12) United States Patent
Shibayama et al.

(10) Patent No.: US 12,074,180 B2
(45) Date of Patent: Aug. 27, 2024

(54) IMAGING ELEMENT AND METHOD OF MANUFACTURING IMAGING ELEMENT

(71) Applicant: SONY SEMICONDUCTOR SOLUTIONS CORPORATION, Kanagawa (JP)

(72) Inventors: Toshikazu Shibayama, Nagasaki (JP); Yusuke Moriya, Nagasaki (JP); Nobuyuki Mitsunaga, Nagasaki (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 960 days.

(21) Appl. No.: 16/976,749

(22) PCT Filed: Jan. 21, 2019

(86) PCT No.: PCT/JP2019/001598
§ 371 (c)(1),
(2) Date: Aug. 29, 2020

(87) PCT Pub. No.: WO2019/171787
PCT Pub. Date: Sep. 12, 2019

(65) Prior Publication Data
US 2021/0005656 A1 Jan. 7, 2021

(30) Foreign Application Priority Data
Mar. 7, 2018 (JP) .................. 2018-040618

(51) Int. Cl.
*H01L 27/146* (2006.01)
*G02B 1/04* (2006.01)
*G02B 1/11* (2015.01)

(52) U.S. Cl.
CPC ........ *H01L 27/14618* (2013.01); *G02B 1/041* (2013.01); *G02B 1/11* (2013.01);
(Continued)

(58) Field of Classification Search
CPC .......... H01L 27/14618; H01L 27/1462; H01L 27/14627; H01L 27/14685; G02B 1/041; G02B 1/11
See application file for complete search history.

(56) References Cited

U.S. PATENT DOCUMENTS 6,040,591 A 3/2000 Otsuka
2009/0014824 A1* 1/2009 Sakoh .............. H01L 27/14627
257/432

(Continued)

FOREIGN PATENT DOCUMENTS

CN 102446937 A 5/2012
CN 105308746 A 2/2016
(Continued)

OTHER PUBLICATIONS

International Search Report and Written Opinion of PCT Application No. PCT/JP2019/001598, issued on Apr. 2, 2019, 10 pages of ISRWO.

*Primary Examiner* — Christine A Enad
(74) *Attorney, Agent, or Firm* — CHIP LAW GROUP

(57) ABSTRACT

To reduce reflection of incident light in an imaging element having a transparent resin arranged on a surface of a microlens. The imaging element includes a pixel, a microlens, a transparent resin layer, and a sealing glass. The pixel is formed on a semiconductor substrate and generates an image signal according to radiated light. The microlens is arranged adjacent to the pixel, collects incident light, irradiates the pixel with the incident light, and flattens a surface of the pixel. The transparent resin layer is arranged adjacent to the microlens and has a refractive index different from a refractive index of the microlens by a predetermined difference. The sealing glass is arranged adjacent to the transparent resin and seals the semiconductor substrate.

8 Claims, 13 Drawing Sheets

(52) U.S. Cl.
CPC .... *H01L 27/1462* (2013.01); *H01L 27/14621* (2013.01); *H01L 27/14623* (2013.01); *H01L 27/14627* (2013.01); *H01L 27/1464* (2013.01); *H01L 27/14645* (2013.01); *H01L 27/14685* (2013.01)

(56) References Cited

U.S. PATENT DOCUMENTS

| | | | |
|---|---|---|---|
| 2015/0205013 A1* | 7/2015 | Akasaka | G02F 1/133606 359/619 |
| 2016/0013233 A1* | 1/2016 | Noudo | H01L 27/14685 438/69 |
| 2016/0172401 A1 | 6/2016 | Kawasaki et al. | |
| 2018/0303325 A1 | 10/2018 | Fujimori | |

FOREIGN PATENT DOCUMENTS

| | | |
|---|---|---|
| CN | 106935603 A | 7/2017 |
| EP | 3369363 A1 | 9/2018 |
| JP | 10-270672 A | 10/1998 |
| JP | 2003-037257 A | 2/2003 |
| JP | 2014-168098 A | 9/2014 |
| JP | 2016-115706 A | 6/2016 |
| WO | 2014/141991 A1 | 9/2014 |
| WO | 2017/073440 A1 | 5/2017 |

\* cited by examiner

IMAGING ELEMENT AND METHOD OF MANUFACTURING IMAGING ELEMENT

CROSS REFERENCE TO RELATED APPLICATIONS

This application is a U.S. National Phase of International Patent Application No. PCT/JP2019/001598 filed on Jan. 21, 2019, which claims priority benefit of Japanese Patent Application No. JP 2018-040618 filed in the Japan Patent Office on Mar. 7, 2018. Each of the above-referenced applications is hereby incorporated herein by reference in its entirety.

TECHNICAL FIELD

The present disclosure relates to an imaging element and a method of manufacturing an imaging element. Specifically, the present disclosure relates to an imaging element including a microlens and a method of manufacturing the imaging element.

BACKGROUND ART

Conventionally, imaging elements having a semiconductor chip for performing image pickup housed in a hollow package with a glass window have been used. To improve reliability, this hollow package is formed using a ceramic or the like. Pixels for converting radiated light into electrical signals are arranged in a two-dimensional lattice manner in the imaging element. A microlens is arranged in each of the plurality of pixels and collects incident light. In the above hollow package, the air enclosed in the package and the microlens are in contact with each other. Since the refractive index of the air is relatively small, a difference in the refractive index between the air and the microlens can be increased, and the incident light can be greatly refracted on a surface of the microlens. Therefore, the efficiency of collecting incident light by the microlens can be improved.

In contrast, there has been proposed an imaging element having a simplified configuration in which a sealing glass is bonded to a light-receiving surface of a semiconductor chip via a transparent resin. In the case of this imaging element, a microlens comes into contact with the transparent resin. Since the transparent resin has a higher refractive index than the air, a difference in the refractive index on the surface of the microlens can be secured and a decrease in a light collection rate can be reduced by adopting silicon nitride (SiN) having a larger refractive index as a microlens material. For example, a solid-state imaging element has been proposed, which has a light-transmissive insulating layer, a first flattened layer, a color filter, a second flattened layer, a stress relaxation layer, a microlens containing SiN, and a transparent resin layer stacked in order on a semiconductor substrate including a photoelectric conversion unit (for example, see Patent Document 1). In this solid-state imaging element, the second flattened layer is formed using an organic material, and thus the stress relaxation layer is arranged between the second flattened layer and the microlens formed using an inorganic material. This stress relaxation layer has an intermediate film stress between the second flattened film and the microlens, and relaxes a stress difference between the second flattened film and the microlens.

CITATION LIST

Patent Document

Patent Document 1: Japanese Patent Application Laid-Open No. 2014-168098

SUMMARY OF THE INVENTION

Problems to be Solved by the Invention

Since, in the above-described conventional technology, the plurality of layers having different refractive indexes is arranged between the microlens and the color filter, there is a problem that the incident light is reflected at an interface between these layers. Since the reflected incident light is reflected again at the interface between the sealing glass and the air (outside air) and enters the pixel, there is a problem that the image quality is deteriorated.

The present disclosure has been made in view of the above-mentioned problems, and an object thereof is to reduce reflection of incident light in an imaging element having a transparent resin arranged on a surface of a microlens.

Solutions to Problems

The present disclosure has been made to solve the above-described problems, and the first aspect thereof is an imaging element including: a pixel formed on a semiconductor substrate, and configured to generate an image signal according to radiated light; a microlens arranged adjacent to the pixel, and configured to collect incident light, irradiate the pixel with the incident light, and flatten a surface of the pixel; a transparent resin layer arranged adjacent to the microlens, and having a refractive index different from a refractive index of the microlens by a predetermined difference; and a sealing glass arranged adjacent to the transparent resin and sealing the semiconductor substrate.

Furthermore, in the first aspect, the transparent resin layer may have the refractive index having the predetermined difference of 0.4 to 0.6.

Furthermore, in the first aspect, the transparent resin layer may include a first transparent resin layer arranged adjacent to the microlens and having the refractive index different from the refractive index of the microlens by the predetermined difference, and a second transparent resin layer having the refractive index different from the first transparent resin layer.

Furthermore, in the first aspect, the transparent resin layer may include an antireflection layer between the first transparent resin layer and the second transparent resin layer.

Furthermore, in the first aspect, the microlens may be formed using an organic material.

Furthermore, in the first aspect, the microlens may include a lens portion formed using an inorganic material, and a flattened portion having substantially the same refractive index as the lens portion and arranged adjacent to the pixel.

Furthermore, in the first aspect, the microlens may include an antireflection film.

Furthermore, in the first aspect, the microlens may include a region that is an uneven surface of the microlens as the antireflection film.

Furthermore, in the first aspect, an imaging lens arranged adjacent to a surface of the sealing glass may be further included, the surface being different from a surface of the sealing glass where the transparent resin layer is arranged.

Furthermore, the second aspect of the present technology is a method of manufacturing an imaging element, the method including: a pixel forming process of forming a pixel on a semiconductor substrate, the pixel being configured to generate an image signal according to radiated light; a microlens arranging process of arranging a microlens adjacent to the formed pixel, the microlens collecting incident light to irradiate the pixel with the incident light, and flattening a surface of the pixel; a transparent resin layer arranging process of arranging a transparent resin layer adjacent to the arranged microlens, the transparent resin layer having a refractive index different from a refractive index of the microlens by a predetermined difference; and a sealing process of arranging a sealing glass adjacent to the arranged transparent resin layer, the sealing glass sealing the semiconductor substrate.

Such an aspect brings about an effect of, while using the microlens having the refractive index having a predetermined difference from the refractive index of the transparent resin layer, flattening the surface of the pixel by the microlens. A film for flattening the surface of the pixel can be omitted, and in the imaging element having the transparent resin layer and the sealing glass arranged adjacent to the microlens arranged in the pixel, reduction of reflection of incident light at the surface of the pixel is assumed.

Effects of the Invention

According to the present disclosure, an excellent effect of reducing reflection of incident light in the imaging element having the transparent resin arranged on the surface of the microlens is exhibited.

MODE FOR CARRYING OUT THE INVENTION

Figure 1:
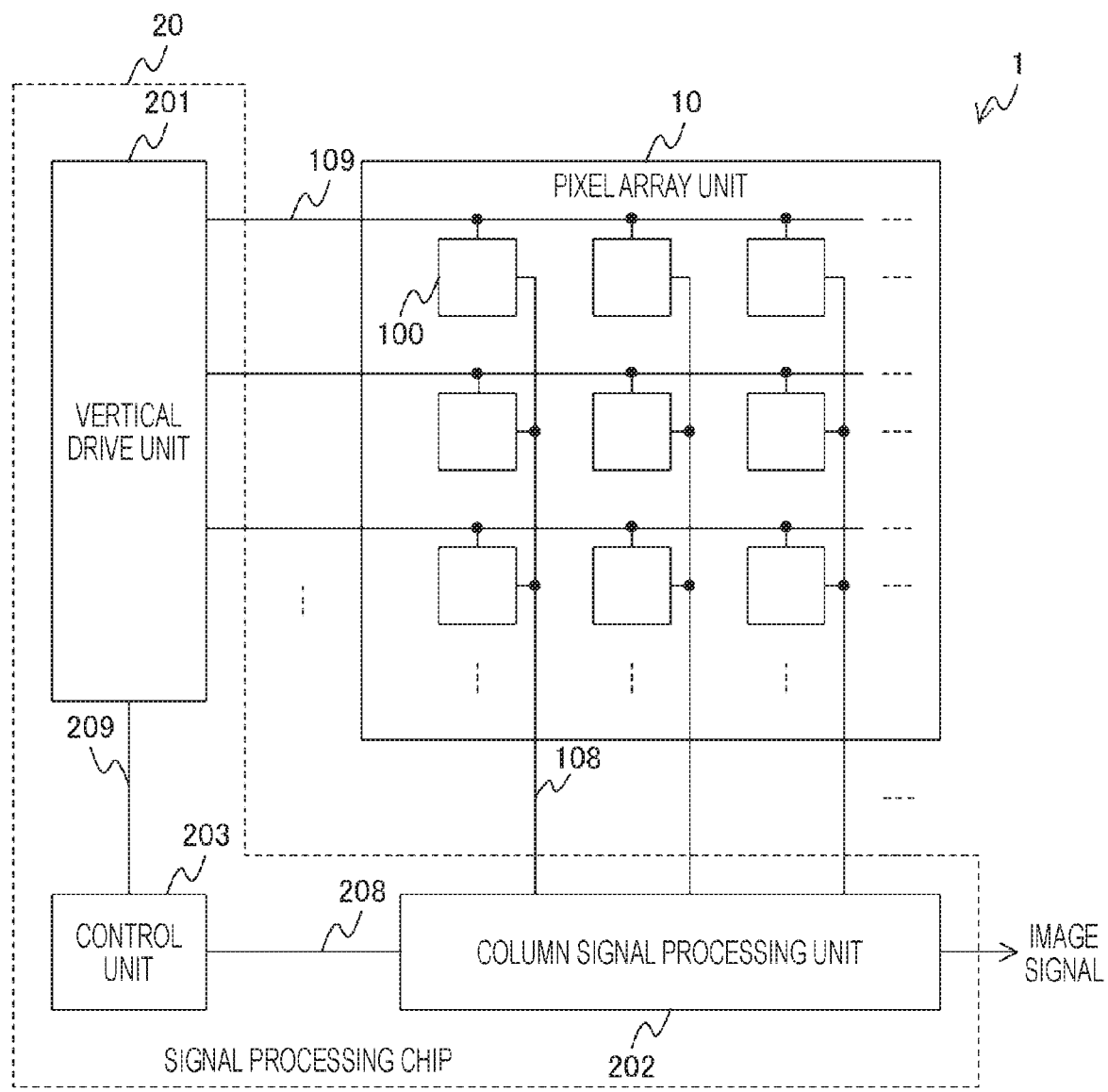
FIG. 1 is a diagram illustrating a configuration example of an imaging element according to an embodiment of the present disclosure.

Next, embodiments for implementing the present disclosure (hereinafter referred to as embodiments) will be described with reference to the drawings. In the drawings below, the same or similar parts are denoted by the same or similar reference numerals. Note that the drawings are schematic, and the dimensional ratios and the like of the respective parts do not always correspond to actual ones. Furthermore, it is needless to say that dimensional relationships and ratios are different among the drawings. Furthermore, the embodiments will be described in the following order.

1. First Embodiment
2. Second Embodiment
3. Third Embodiment
4. Fourth Embodiment
5. Fifth Embodiment
6. Application to Camera 1. First Embodiment

[Configuration of Imaging Element]

FIG. 1 is a diagram illustrating a configuration example of an imaging element according to an embodiment of the present disclosure. An imaging element 1 in FIG. 1 includes a pixel array unit 10, a vertical drive unit 201, a column signal processing unit 202, and a control unit 203.

The pixel array unit 10 has pixels 100 arranged in a two-dimensional lattice manner. Here, the pixel 100 generates an image signal corresponding to radiated light. The pixel 100 includes a photoelectric conversion unit that generates a charge according to the radiated light. Furthermore, the pixel 100 further includes a pixel circuit. This pixel circuit generates the image signal based on the charge generated by the photoelectric conversion unit. Generation of the image signal is controlled by a control signal generated by the vertical drive unit 201 described below. In the pixel array unit 10, signal lines 109 and 108 are arranged in an XY matrix manner. The signal line 109 is a signal line for transmitting the control signal of the pixel circuit in the pixel 100, is arranged for each row of the pixel array unit 10, and is commonly wired to the pixels 100 arranged in each row. The signal line 108 is a signal line for transmitting the image signal generated by the pixel circuit of the pixel 100, is arranged for each column of the pixel array unit 10, and is commonly wired to the pixels 100 arranged in each column. The photoelectric conversion units and pixel circuits are formed on a semiconductor substrate.

The vertical drive unit 201 generates the control signal for the pixel circuit of the pixel 100. The vertical drive unit 201 transmits the generated control signal to the pixel 100 via the signal line 109 in FIG. 1. The column signal processing unit 202 processes the image signal generated by the pixel 100. The column signal processing unit 202 processes the image signal transmitted from the pixel 100 via the signal line 108 in FIG. 1. The processing in the column signal processing unit 202 corresponds to, for example, analog-digital conversion for converting an analog image signal generated in the pixel 100 into a digital image signal. The image signal processed by the column signal processing unit 202 is output as the image signal of the imaging element 1. The control unit 203 controls the entire imaging element 1. The control unit 203 controls the imaging element 1 by generating and outputting the control signal for controlling the vertical drive unit 201 and the column signal processing unit 202. The control signal generated by the control unit 203 is transmitted to each of the vertical drive unit 201 and the column signal processing unit 202 via the signal lines 209 and 208.

The vertical drive unit 201, the column signal processing unit 202, and the control unit 203 described above are formed on a semiconductor chip different from the pixel array unit 10. Specifically, the vertical drive unit 201, the column signal processing unit 202, and the control unit 203 are formed on a signal processing chip 20. As will be described below, the signal processing chip 20 is bonded to and stacked on a semiconductor chip configuring the pixel array unit 10 to form one semiconductor package.

[Circuit Configuration of Pixel]

Figure 2:
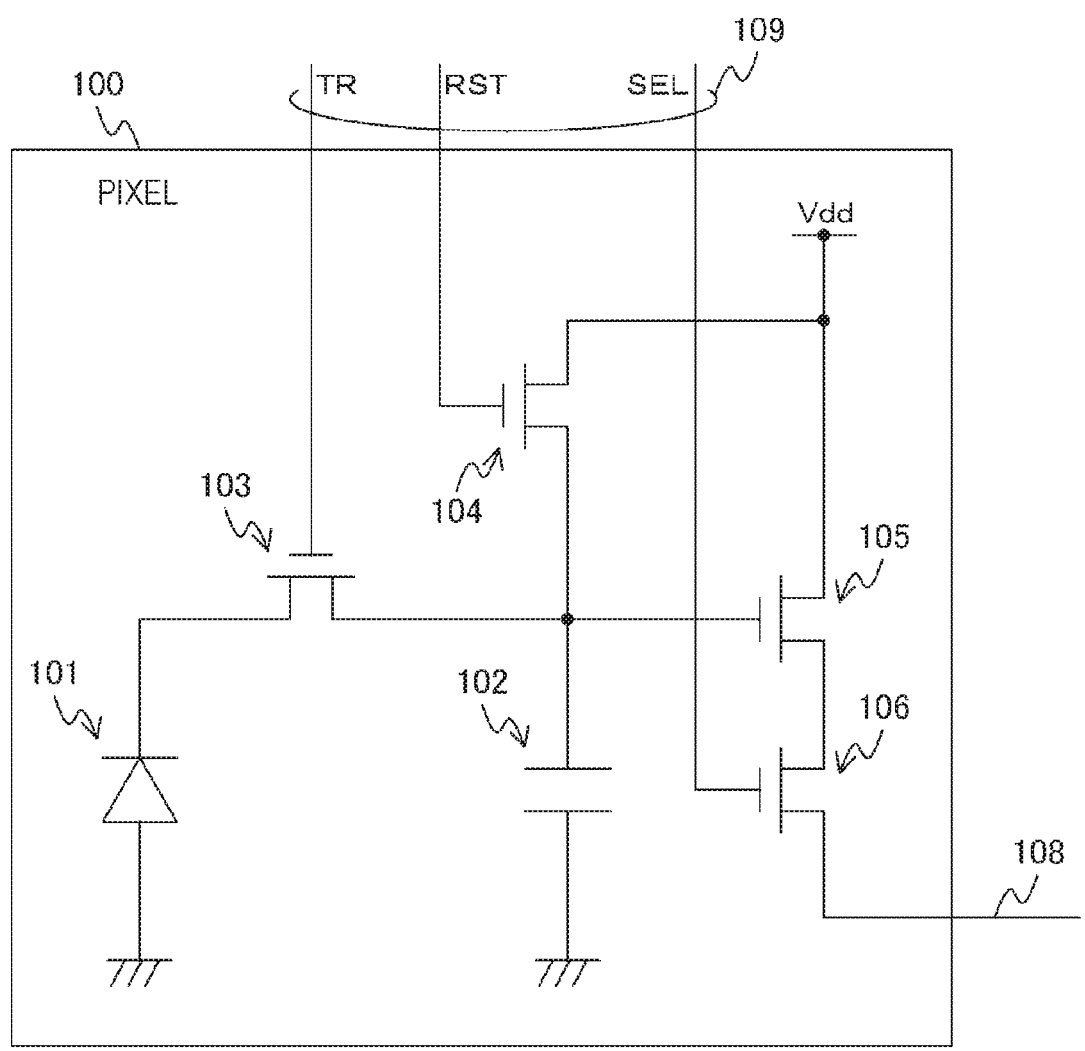
FIG. 2 is a diagram illustrating a configuration example of a pixel according to an embodiment of the present disclosure.

FIG. 2 is a diagram illustrating a configuration example of a pixel according to an embodiment of the present disclosure. FIG. 2 is a circuit diagram illustrating a configuration example of the pixel 100. The pixel 100 in FIG. 2 includes a photoelectric conversion unit 101, a charge holding unit 102, and MOS transistors 103 to 106.

An anode of the photoelectric conversion unit 101 is grounded and a cathode of the photoelectric conversion unit 101 is connected to a source of the MOS transistor 103. A drain of the MOS transistor 103 is connected to a source of the MOS transistor 104, a gate of the MOS transistor 105, and one end of the charge holding unit 102. The other end of the charge holding unit 102 is grounded. Drains of the MOS transistors 104 and 105 are commonly connected to a power supply line Vdd, and a source of the MOS transistor 105 is connected to a drain of the MOS transistor 106. A source of the MOS transistor 106 is connected to the signal line 108. Gates of the MOS transistors 103, 104 and 106 are connected to a transfer signal line TR, a reset signal line RST, and a selection signal line SEL, respectively. Note that the transfer signal line TR, the reset signal line RST, and the selection signal line SEL configure the signal line 109.

The photoelectric conversion unit 101 generates the charge according to the radiated light as described above. A photodiode can be used for the photoelectric conversion unit 101. Furthermore, the charge holding unit 102 and the MOS transistors 103 to 106 configure the pixel circuit.

The MOS transistor 103 is a transistor that transfers the charge generated by the photoelectric conversion of the photoelectric conversion unit 101 to the charge holding unit 102. The transfer of the charge in the MOS transistor 103 is controlled by the signal transmitted through the transfer signal line TR. The charge holding unit 102 is a capacitor that holds the charge transferred by the MOS transistor 103. The MOS transistor 105 is a transistor that generates a signal based on the charge held in the charge holding unit 102. The MOS transistor 106 is a transistor that outputs the signal generated by the MOS transistor 105 to the signal line 108 as the image signal. The MOS transistor 106 is controlled by the signal transmitted by the selection signal line SEL.

The MOS transistor 104 is a transistor that resets the charge holding unit 102 by discharging the charge held in the charge holding unit 102 to the power supply line Vdd. The reset by the MOS transistor 104 is controlled by the signal transmitted through the reset signal line RST, and is executed before the charge transfer by the MOS transistor 103. Note that, at the time of this resetting, the photoelectric conversion unit 101 can be further reset by causing the MOS transistor 103 to conduct electricity. In this way, the pixel circuit converts the charge generated by the photoelectric conversion unit 101 into the image signal.

[Cross-Sectional Configuration of Imaging Element]

Figure 3:
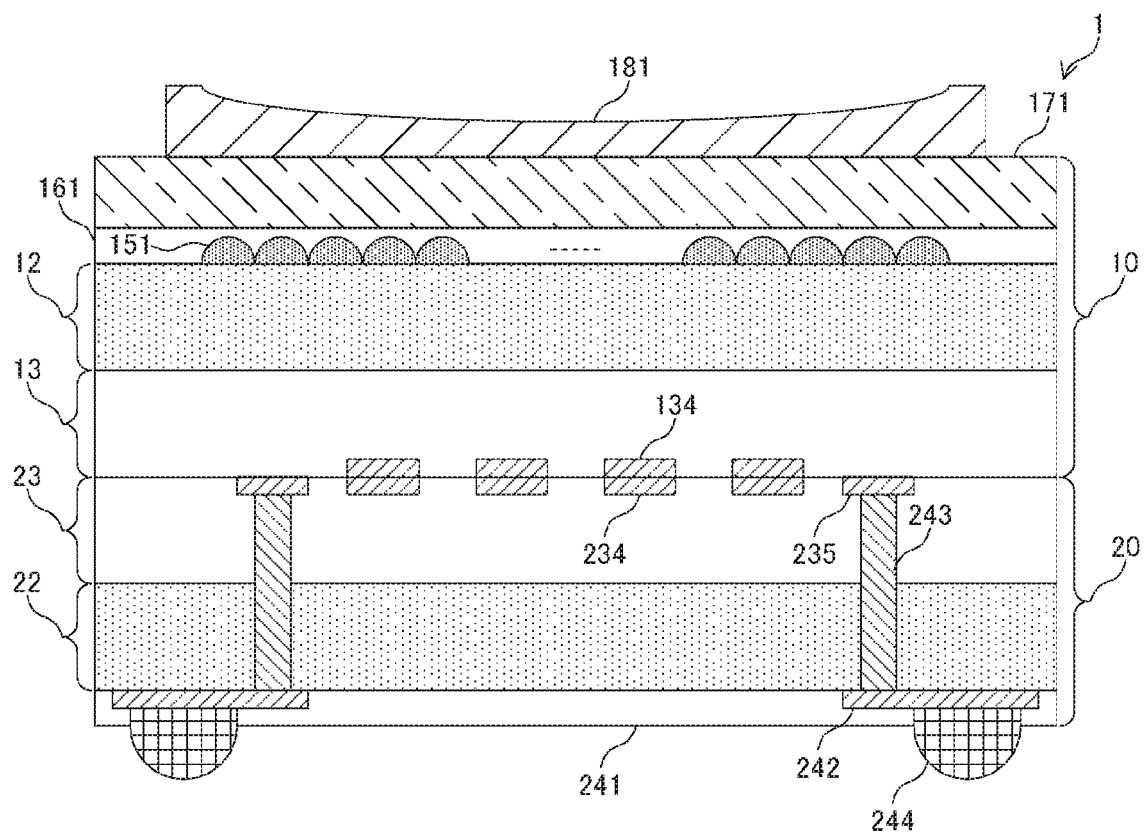
FIG. 3 is a cross-sectional view illustrating a configuration example of an imaging element according to an embodiment of the present disclosure.

FIG. 3 is a cross-sectional view illustrating a configuration example of an imaging element according to an embodiment of the present disclosure. FIG. 3 is a cross-sectional view illustrating the configuration of the imaging element 1. The imaging element 1 in FIG. 3 includes the pixel array unit 10, the signal processing chip 20, and an imaging lens 181.

The pixel array unit 10 in FIG. 3 includes a semiconductor substrate 12, a wiring region 13, a transparent resin layer 161, and a sealing glass 171.

The semiconductor substrate 12 is a semiconductor substrate in which a semiconductor region portion among elements of the pixel 100 arranged in the pixel array unit 10 is formed. The semiconductor substrate 12 can be formed using silicon.

The wiring region 13 is a region where wiring for connecting the elements of the pixel 100 and wiring configuring the signal line 109 and the like are formed. An inter-chip connection pad 134 is arranged in the wiring region 13. The inter-chip connection pad 134 is an electrode that is connected to an inter-chip connection pad 234 arranged in the signal processing chip 20 described below and exchanges signals and the like. The inter-chip connection pad 134 can be formed using metal (for example, copper (Cu)).

A microlens 151 is formed on a back surface of the semiconductor substrate 12, the back surface being a surface different from a front surface on which the wiring region 13 is arranged. The microlens 151 is a lens that collects incident light and radiates the incident light on the pixel 100 arranged in the pixel array unit 10. The imaging element with the type of imaging the incident light radiated on the back surface of the semiconductor substrate 12 is referred to as a back-illuminated imaging element.

The sealing glass 171 is a glass that seals the imaging element 1 and protects the imaging element 1. As the sealing glass 171, for example, glass having a refractive index of 1.5 can be used.

The transparent resin layer 161 is a transparent resin arranged between the semiconductor substrate 12 and the sealing glass 171. The transparent resin layer 161 is a resin arranged adjacent to the microlens 151 on the front surface of the semiconductor substrate 12 and bonding the sealing glass 171 to the semiconductor substrate 12. Furthermore, the transparent resin layer 161 has a refractive index different from a refractive index of the microlens 151 by a predetermined difference. Furthermore, by setting the refractive index of the transparent resin layer 161 to be 1.5, which is the same as that of the sealing glass 171, reflection of the incident light at an interface between the sealing glass 171 and the transparent resin layer 161 can be reduced. Details of the configurations of the transparent resin layer 161 and the microlens 151 will be described below.

The signal processing chip 20 includes a semiconductor substrate 22, a wiring region 23, a through electrode 243, a back surface-side pad 242, a resin layer 241, and a solder ball 244.

The semiconductor substrate 12 is a semiconductor substrate formed using silicon or the like, and in which a semiconductor region portion among elements configuring the vertical drive unit 201, the column signal processing unit 202, and the control unit 203 included in the signal processing chip 20 is formed.

The wiring region 23 is a region in which wiring for connecting the elements included in the signal processing chip 20 and the like are formed. The inter-chip connection pad 234 connected with the inter-chip connection pad 134 of the pixel array unit 10 is arranged in the wiring region 23. Furthermore, a front surface-side pad 235 is arranged in the wiring region 23. The front surface-side pad 235 is an electrode connected to the back surface-side pad 242 via the through electrode 243 to be described below.

The back surface-side pad 242 is arranged on a back surface of the semiconductor substrate 22. The back surface-side pad 242 is an electrode for being connected with an external circuit such as an image processing device connected to the imaging element 1. The through electrode 243 is arranged between the front surface-side pad 235 and the back surface-side pad 242, and electrically connects the front surface-side pad 235 and the back surface-side pad 242. The back surface-side pad 242 and the through electrode 243 can be formed using metal (for example, Cu).

The solder ball 244 is a hemispherical solder arranged adjacent to the back surface-side pad 242. The solder ball 244 is solder for mounting the imaging element 1 on a substrate of an external circuit. The resin layer 241 is a resin for protecting the signal processing chip 20 and the back surface-side pad 242. For the resin layer 241, for example, a solder resist can be used.

The wiring region 13 of the pixel array unit 10 and the wiring region 23 of the signal processing chip 20 are joined, so that the pixel array unit 10 and the signal processing chip 20 are stacked. At this time, the inter-chip connection pads 134 and 234 are adjacently joined. Specifically, the pixel array unit 10 and the signal processing chip 20 are brought into contact with each other by aligning the inter-chip connection pads 134 and 234 so as to be adjacent to each other, and the pixel array unit 10 and the signal processing chip 20 are heated and pressure-welded. As a result, the wiring regions 13 and 23 are connected, and the inter-chip connection pads 134 and 234 are mechanically and electrically connected. As a result, transmission of signals between the pixel array unit 10 and the signal processing chip 20 becomes possible. Such connection between semiconductor chips is called Cu—Cu connection. The signal lines 108 and 109 illustrated in FIG. 1 include this Cu—Cu connection.

The imaging lens 181 is called wafer level lens, and is an imaging lens formed integrally with the imaging element 1.

Note that the configuration of the imaging element 1 is not limited to this example. For example, a configuration in which a pad for solder connection may be arranged in an island shape with respect to the resin layer 241 may be adopted instead of the solder ball 244. Furthermore, the imaging element 1 without the imaging lens 181 can be adopted.

[Configuration of Pixel]

Figure 4:
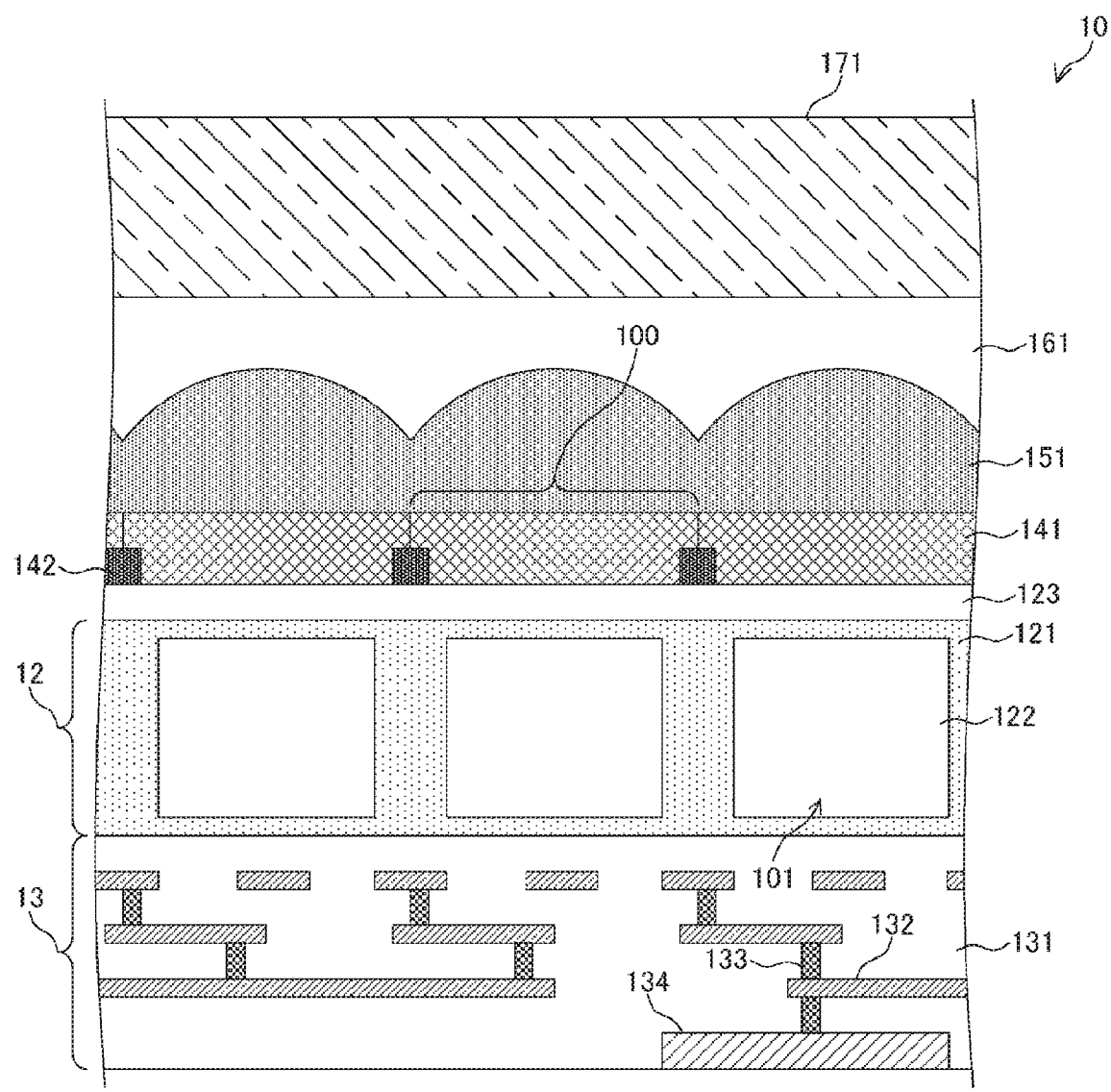
FIG. 4 is a cross-sectional view illustrating a configuration example of a pixel according to a first embodiment of the present disclosure.

FIG. 4 is a cross-sectional view illustrating a configuration example of the pixel according to the first embodiment of the present disclosure. FIG. 4 is a cross-sectional view illustrating a region, in which the pixel 100 is formed, of the pixel array unit 10.

The pixel 100 in FIG. 4 includes the semiconductor substrate 12, the wiring region 13, an insulating film 123, a light-shielding film 142, a color filter 141, and a microlens 151.

In the semiconductor substrate 12, for example, a p-type well region 121 is formed, and the semiconductor region of the elements configuring the pixel 100 is formed in the well region 121. For the sake of convenience, the semiconductor substrate 12 in FIG. 4 is assumed to be formed using the well region 121. The photoelectric conversion unit 101 illustrated in FIG. 2 is illustrated in FIG. 4 as an example of the elements configuring the pixel 100. A semiconductor region 122 in FIG. 4 is an n-type semiconductor region. The photoelectric conversion unit 101 is formed using the semiconductor region 122 and the well region around the semiconductor region 122. A photodiode is formed by pn junction at an interface between the n-type semiconductor region 122 and the p-type well region.

An insulating layer 131, a wiring layer 132, and a via plug 133 are arranged in the wiring region 13. The wiring layer 132 is a wire that transmits a signal. The elements configuring the pixel 100 are wired by the wiring layer 132. The wiring layer 132 can be formed using metal such as Cu.

The insulating layer insulates the wiring layer 132. The insulating layer 131 can be formed using, for example, an insulating material such as silicon oxide ($SiO_2$). The wiring layer 132 and the insulating layer 131 can be formed in multiple layers. FIG. 4 illustrates an example of the wiring layer 132 and the insulating layer 131 formed in three layers. The via plug 133 connects the wiring layers 132 formed in different layers. The via plug 133 can be formed using, for example, Cu or tungsten (W).

The wiring layer 132 is connected to the inter-chip connection pad 134 arranged on the surface of the wiring region 13 via the via plug 133. The wiring layer 132, the via plugs 133, and the inter-chip connection pad 134 configure the signal line 109 and the like in the pixel array unit 10, as described above.

The insulating film 123 is a film that insulates the semiconductor substrate 12. The insulating film 123 can be formed using, for example, $SiO_2$.

The color filter 141 is an optical filter that transmits light having a predetermined wavelength of light entering the pixel 100. As the color filter 141, a color filter that transmits any of red light, green light, or blue light can be arranged. The color filter 141 can be formed using an organic material, for example, a resin in which a pigment or a dye is dispersed. At this time, the color filter 141 has a different thickness and a different refractive index depending on the wavelength of the light to transmit. The color filter 141 has a refractive index of, for example, 1.6 to 1.8.

The light-shielding film 142 is disposed between the pixels 100 and shields incident light. The light-shielding film 142 shields light obliquely incident from the adjacent pixel 100. With the light-shielding film 142, incidence of light transmitted through the color filter 141 corresponding to a different color of the adjacent pixel 100 can be prevented, and occurrence of color mixture can be prevented.

The microlens 151 is a hemispherical lens that collects incident light on the photoelectric conversion unit 101 of the pixel 100. The microlens 151 is arranged for each pixel 100, and is arranged adjacent to the pixel 100. The microlens 151 is arranged adjacent to the color filter 141 in the pixel 100 in FIG. 4. Furthermore, the microlens 151 further flattens the surface of the pixel 100. In FIG. 4, the microlens 151 flattens a surface of the color filter 141. As described above, the color filter 141 is formed to have a different thickness depending on a corresponding color. The microlens 151 in FIG. 4 is formed in a hemispherical shape while flattening the surface of the color filter 141. As a result, the heights of the microlenses 151 can be made uniform between the adjacent pixels 100. Furthermore, the microlens 151 in FIG. 4 can be formed using an organic material, and can be a lens having a refractive index of 2.0. Specifically, the microlens 151 can be formed using an acrylic resin in which titanium oxide ($TiO_2$) is dispersed as a filler.

The transparent resin layer 161 is arranged adjacent to the microlens 151 and has a refractive index different from the refractive index of the microlens 151. Thereby, the incident light can be refracted at the interface between the transparent resin layer 161 and the microlens 151. The transparent resin layer 161 can be formed using, for example, an acrylic resin or an epoxy resin. The refractive index can be set to 1.5, for example, using these resins.

The incident light transmitted through the microlens 151 can be refracted more largely and a focal length can be further shortened as the difference in the refractive index between the transparent resin layer 161 and the microlens 151 is larger. For example, 0.4 to 0.6 can be adopted as the difference in the refractive index, and the pixel 100 according to the focal length based on the difference in the refractive index can be formed. In the above example of the microlens 151 and the transparent resin layer 161, the difference in refractive index is 0.5. By adopting the simplified package as described above, the incident light can be collected in the imaging element 1 having the configuration in which an air layer is not arranged on the surface of the microlens 151. The transparent resin layer 161 having a relatively large refractive index can be arranged instead of the air having the refractive index of 1.0.

Furthermore, the microlens 151 formed using an organic material is formed while flattening the surface of the color filter 141. Therefore, a flattened film between the color filter 141 and the microlens 151 can be omitted. Furthermore, since the color filter 141 and the microlens 151 are formed using a resin, thermal expansion coefficients of the color filter 141 and the microlens 151 are relatively close to each other. Therefore, occurrence of a stress due to the difference in the thermal expansion coefficient is reduced, and arrangement of a film that relaxes the stress can be omitted.

In the case of arranging the flattened film or the like between the color filter 141 and the microlens 151, a phenomenon occurs in which the incident light reflected by the flattened film or the like is reflected again at the surface of the sealing glass 171 in contact with the air, and enters the pixel 100. This causes, for example, so-called ring-shaped flare in which concentric light is reflected around an imaged light source, which causes deterioration in image quality. Since the imaging element 1 in FIG. 4 does not need the flattened film or the like, the film configuration of the pixel 100 can be simplified and reflection of the incident light can be reduced. Deterioration of the image quality can be prevented.

[Method of Manufacturing Imaging Element]

Figure 5A:
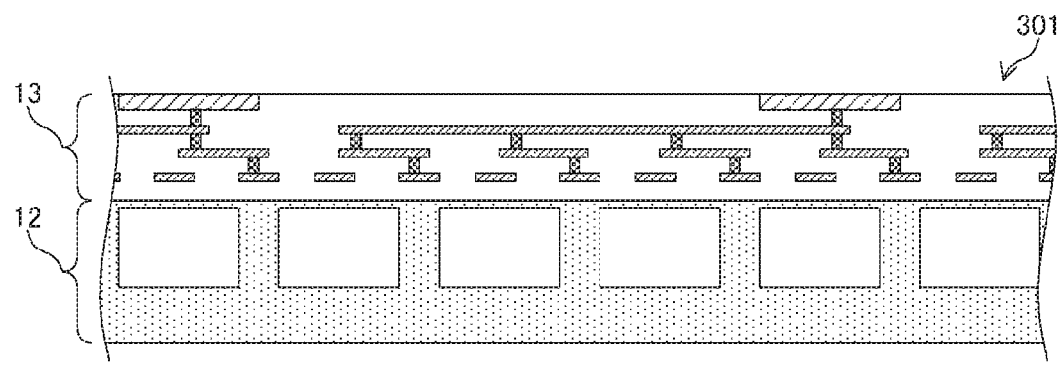
FIGS. 5A, 5B, and 5C are views illustrating an example of a method of manufacturing the imaging element according to the first embodiment of the present disclosure.

FIGS. 5A, 5B, 50, 6A, 6B, 7A, and 7B are views illustrating an example of a method of manufacturing the imaging element according to the first embodiment of the present disclosure. FIGS. 5A, 5B, 50, 6A, 6B, 7A, and 7B are views illustrating an example of a process of manufacturing the imaging element 1. First, the well region 121, the semiconductor region 122, and the like are formed on a semiconductor wafer 301 configuring the semiconductor substrate 12. Next, the wiring region 13 is formed on the surface of the semiconductor substrate 12 (FIG. 5A).

Figure 5B:
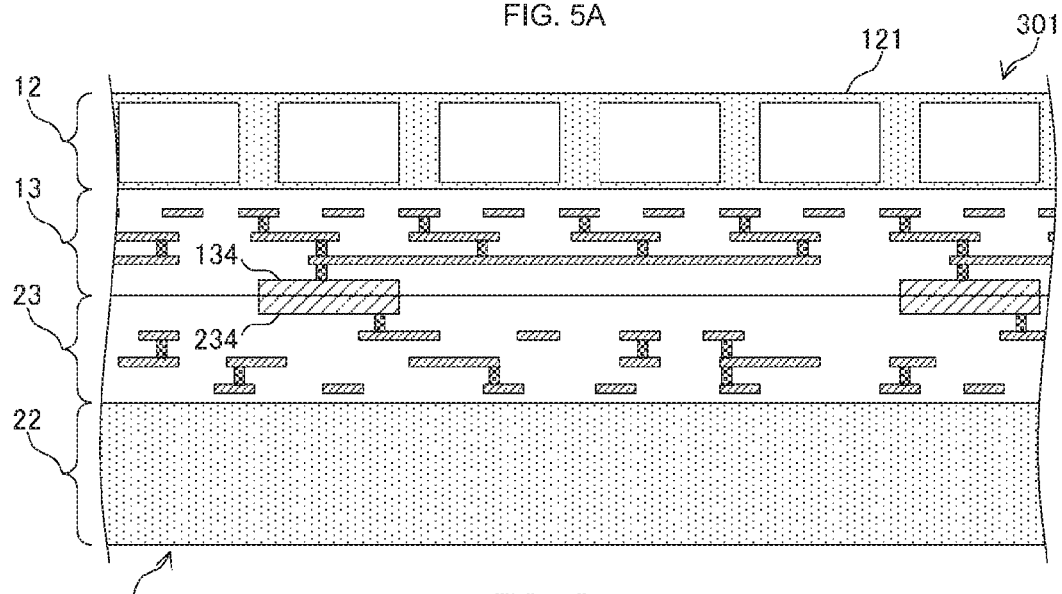

Next, the semiconductor wafer 301 configuring the semiconductor substrate 12 is inverted and bonded to a semiconductor wafer 302 configuring the semiconductor substrate 22 in which the wiring region 23 is formed. At this time, Cu—Cu connection is formed between the inter-chip connection pads 134 and 234. Next, the surface of the semiconductor wafer 301 configuring the semiconductor substrate 12 is ground to reduce the thickness (FIG. 5B).

Figure 5C:
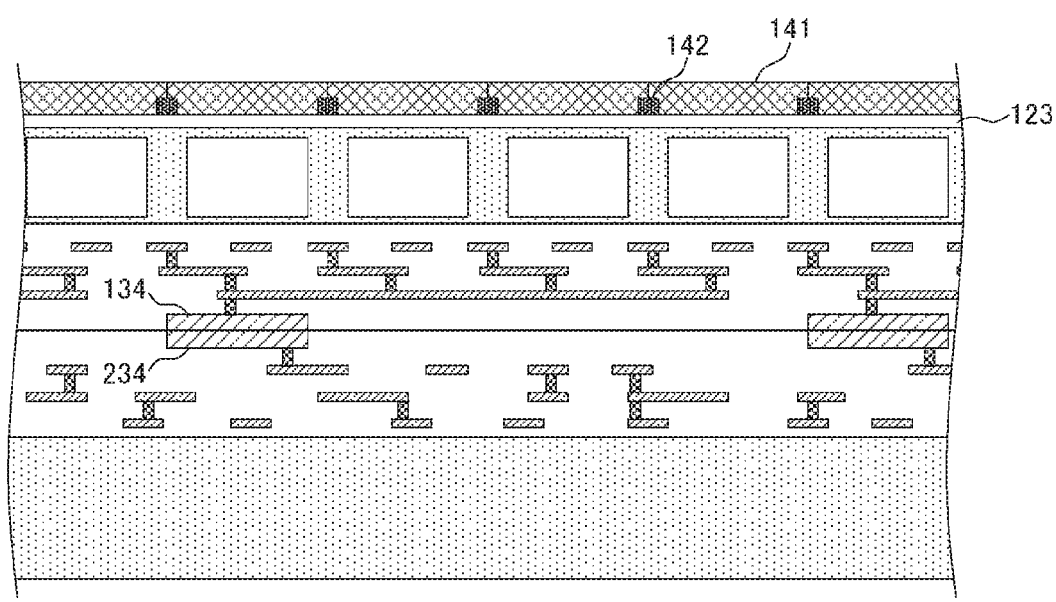

Next, the insulating film 123, the light-shielding film 142, and the color filter 141 are stacked in order on the surface of the semiconductor substrate 12 (FIG. 5C). The pixel 100 can be formed on the semiconductor substrate 12 by the process illustrated in FIGS. 5A, 5B, and 5C.

Figure 6A:
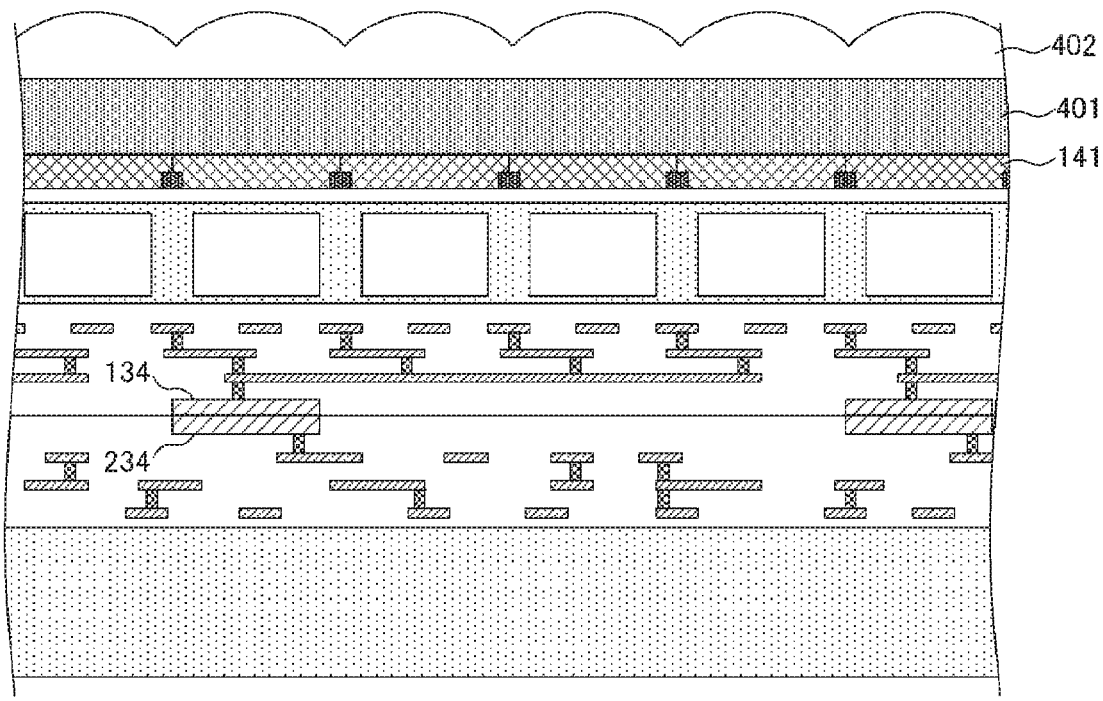
FIGS. 6A and 6B are views illustrating an example of the method of manufacturing the imaging element according to the first embodiment of the present disclosure.

Next, a resin layer 401 serving as a material of the microlens 151 is applied on the surface of the color filter 141, and a resist 402 is arranged on the surface of the resin layer 401. The resist 402 is formed into a hemispherical shape similar to the microlens 151. For example, a resist material is applied, exposed, and developed to form an island-shaped resist. Thereafter, the resist is heated to a temperature equal to or higher than a softening temperature of the resist, using a reflow oven or the like, and is formed into a hemispherical shape (FIG. 6A).

Figure 6B:
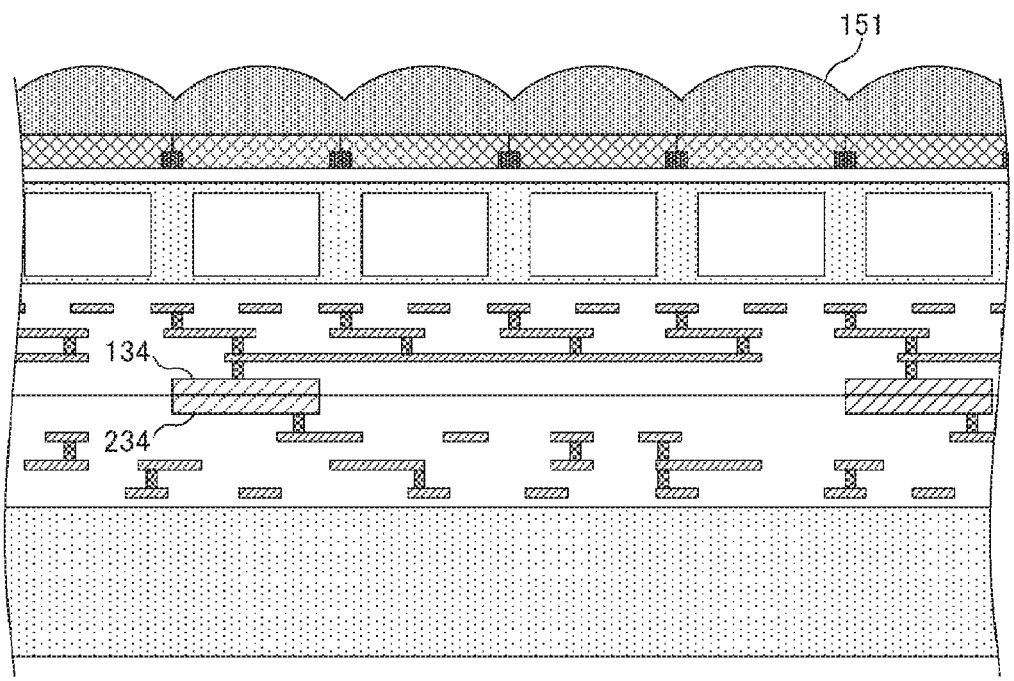

Next, the resin layer 401 is etched using the resist 402 as a mask. Dry etching can be used as the etching. Thereby, the shape of the resist 402 is transferred to the resin layer 401, and the microlens 151 can be formed. Such a method of manufacturing the microlens 151 is called an etch back method (FIG. 6B). By this process, the microlens 151 can be arranged adjacent to the color filter 141 of the pixel 100.

Figure 7A:
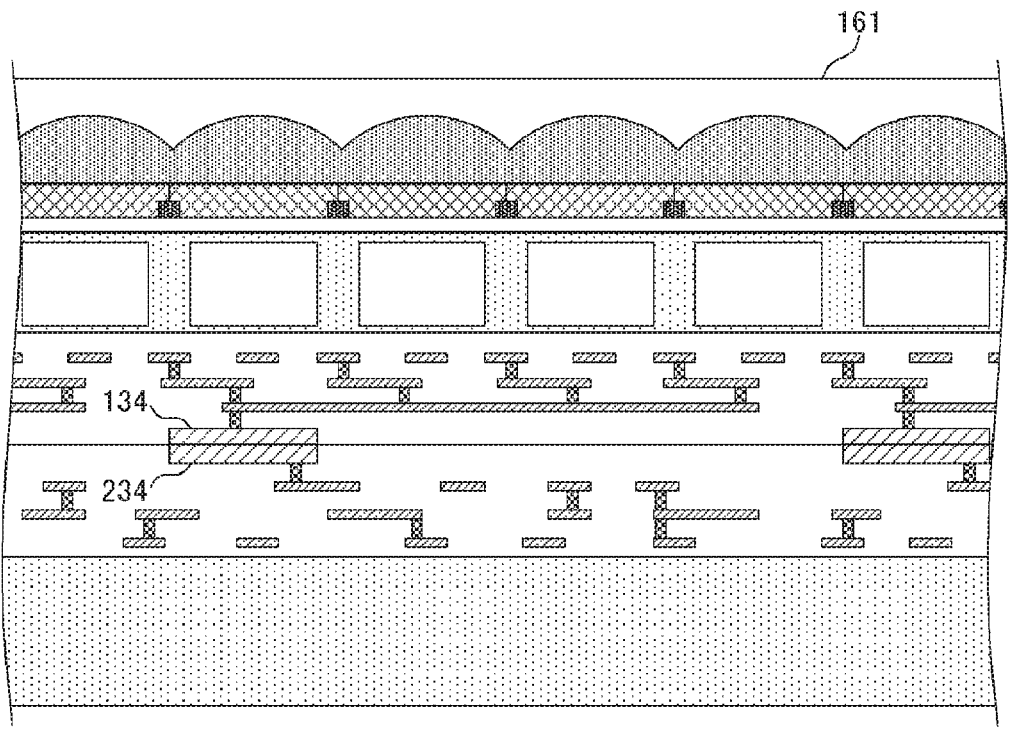
FIGS. 7A and 7B are views illustrating an example of the method of manufacturing the imaging element according to the first embodiment of the present disclosure.
Figure 7B:
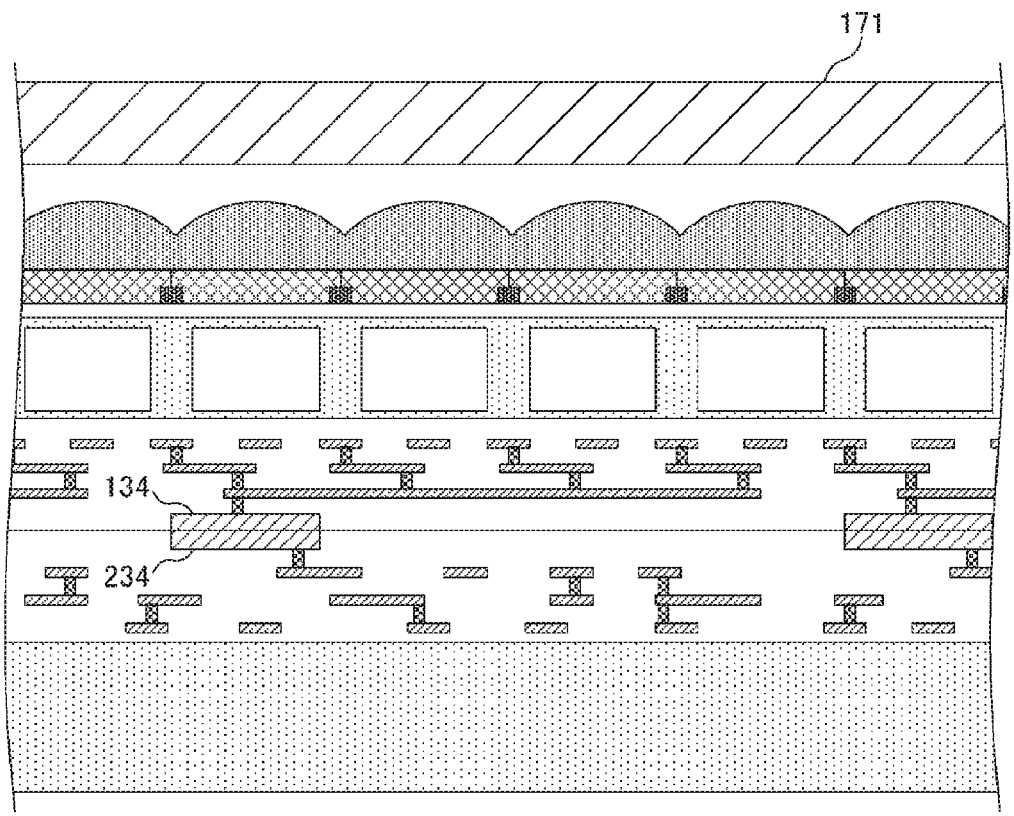

Next, the transparent resin layer 161 is applied to the surface of the microlens 151 (FIG. 7A). Thereby, the transparent resin layer 161 can be arranged adjacent to the microlens 151. Next, the sealing glass 171 is arranged on the surface of the applied transparent resin layer 161, and the transparent resin layer 161 is cured (FIG. 7B). Thereby, the sealing glass 171 can be arranged adjacent to the transparent resin layer 161, and the semiconductor substrate 12 can be sealed with the sealing glass 171.

Next, the through electrode 243 and the back surface-side pad 242 are formed in the semiconductor substrate 22, and the resin layer 241 is applied. The applied resin layer 241 is etched to form an opening adjacent to the back surface-side pad 242, and the solder ball 244 is formed in the opening. Next, the imaging lens 181 is placed on the surface of the sealing glass 171 and is diced into an individual piece. The imaging element 1 can be manufactured by the above processes.

Note that the method of manufacturing the imaging element 1 is not limited to this example. For example, at the time of forming the microlens 151, the material resin of the microlens 151 can be applied to the surface of the color filter 141 by spin coating or the like to flatten the surface of the color filter 141. Thereafter, the material resin of the microlens 151 can be thickly applied to form the resin layer 401.

As described above, for the imaging element 1 according to the first embodiment of the present disclosure, the microlens 151 formed using an organic material and having the refractive index having a predetermined difference from the refractive index of the transparent resin layer 161 is used. As a result, reflection of the incident light in the imaging element having the transparent resin arranged on the surface of the microlens can be reduced.

2. Second Embodiment

The imaging element 1 of the above-described first embodiment has used the microlens 151 formed using an organic material. In contrast, an imaging element 1 according to a second embodiment of the present disclosure is different from the above-described first embodiment in using a microlens formed using an inorganic material.

[Configuration of Pixel]

Figure 8:
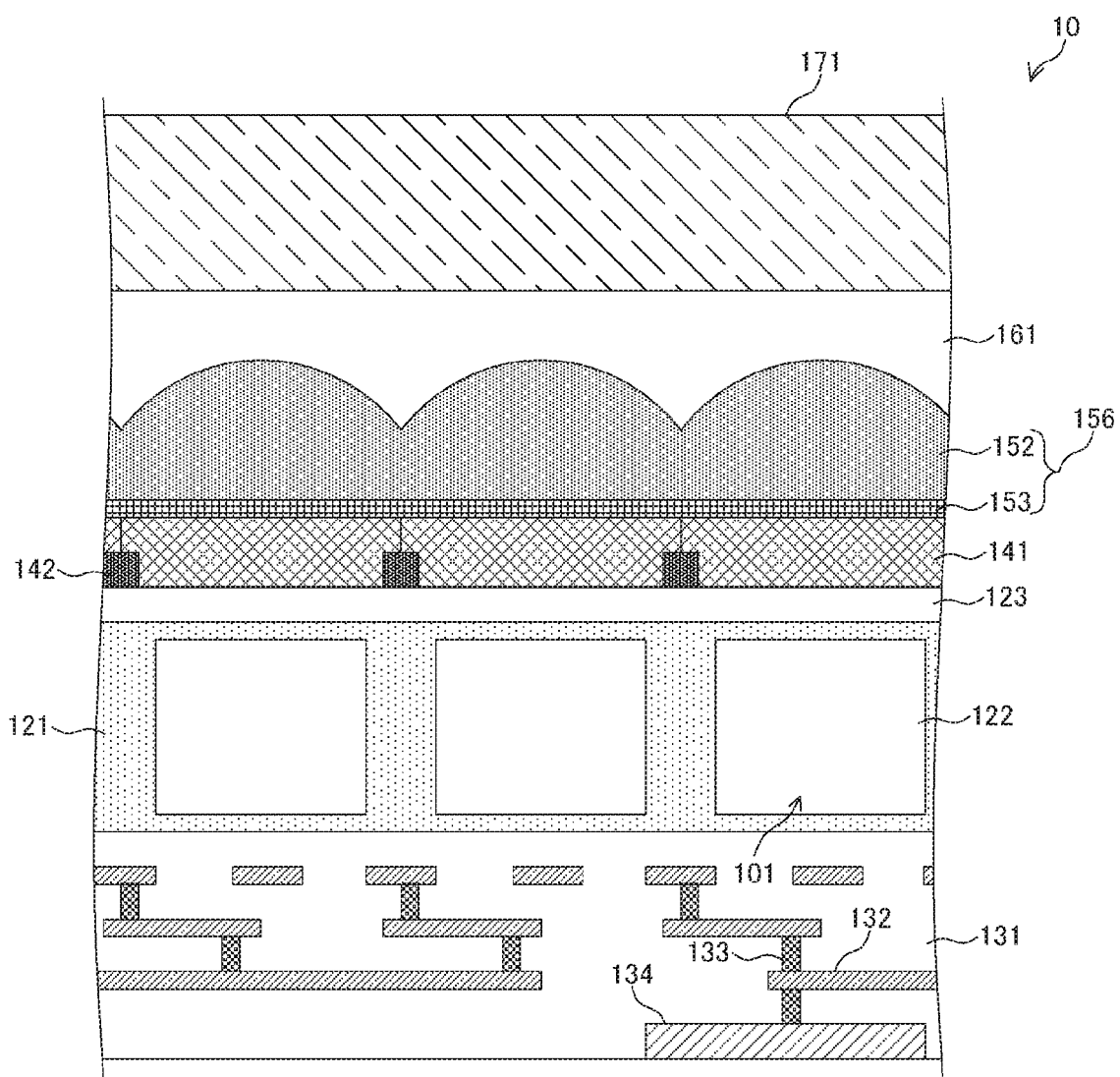
FIG. 8 is a cross-sectional view illustrating a configuration example of a pixel according to a second embodiment of the present disclosure.

FIG. 8 is a cross-sectional view illustrating a configuration example of a pixel according to the second embodiment of the present disclosure. The imaging element 1 in FIG. 8 is different from the imaging element 1 described with reference to FIG. 4 in including a microlens 156 instead of the microlens 151.

The microlens 156 includes a lens portion 152 and a flattened portion 153. The lens portion 152 is a lens formed using an inorganic material. As a material configuring the lens portion 152, an oxide having a refractive index of 2.0 or more or the like can be used, for example. By using the lens portion 152, the difference in the refractive index from a transparent resin layer 161 can be set to 0.5 or more.

The flattened portion 153 is arranged adjacent to a surface of a pixel 100 to flatten the surface of the pixel 100. In FIG. 8, the flattened portion 153 flattens a surface of a color filter 141. A transparent resin can be used for the flattened portion 153. Furthermore, the refractive index of the flattened portion 153 is set to a value substantially same as that of the lens portion 152, whereby reflection of incident light at an interface between the lens portion 152 and the flattened portion 153 can be reduced.

Furthermore, in a case where a film stress of the flattened portion 153 is set to a value between respective film stresses of the lens portion 152 and the color filter 141, the film stresses of the lens portion 152 and the color filter 141 can be relaxed.

Description of configurations other than the above-described configuration of the imaging element 1 is omitted as the configurations are similar to those of the imaging element 1 described in the first embodiment of the present disclosure.

As described above, the imaging element 1 according to the second embodiment of the present disclosure has the flattened portion 153 arranged between the lens portion 152 and the color filter 141, thereby reducing reflection of incident light in the case of using the lens portion 152 formed using an inorganic material.

3. Third Embodiment

The imaging element 1 of the above-described embodiment has used the single-layer transparent resin layer 161. In contrast, an imaging element 1 according to a third embodiment of the present disclosure is different from the above-described first embodiment in using a transparent resin layer including a plurality of layers.

[Configuration of Pixel]

Figure 9:
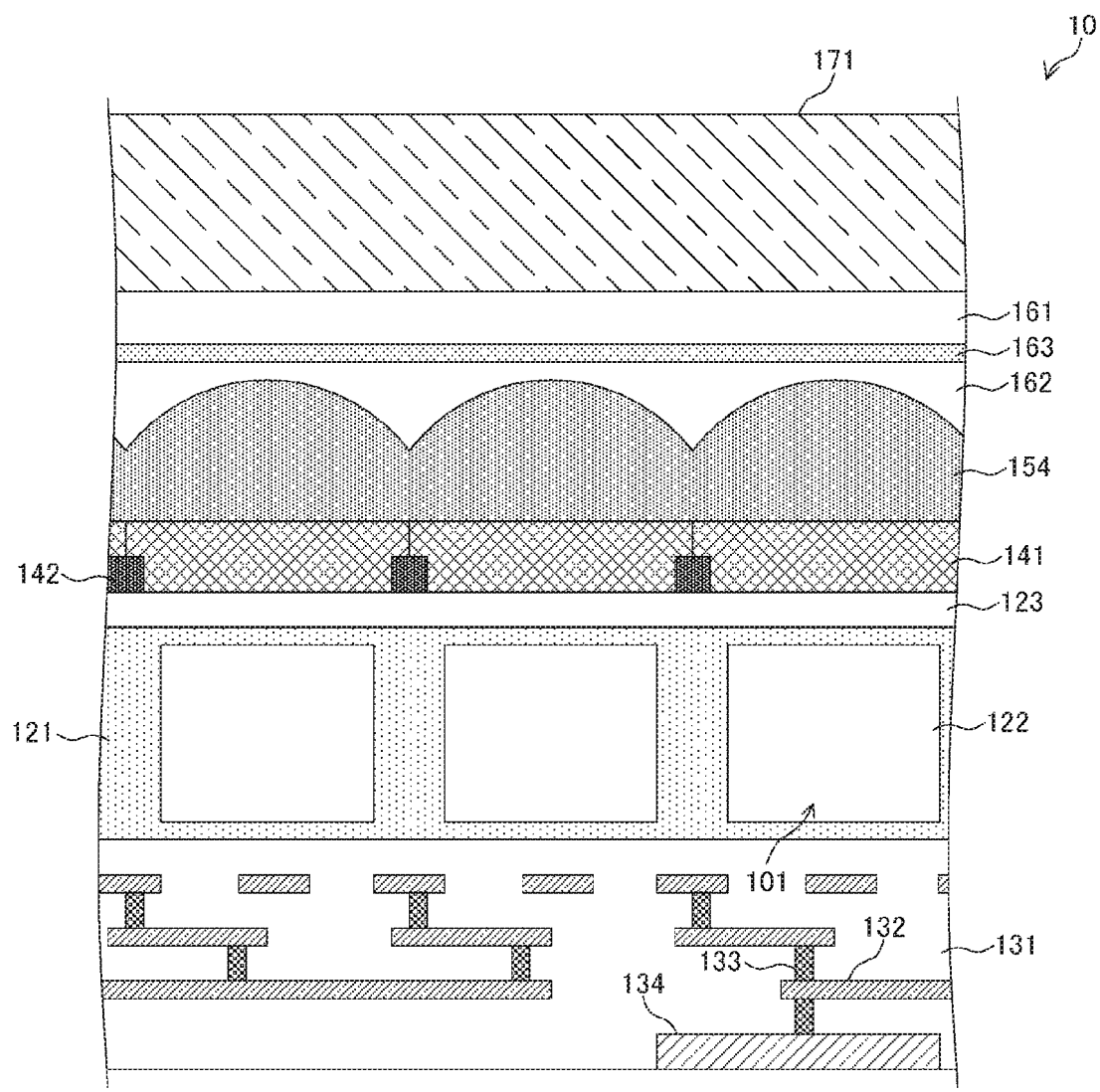
FIG. 9 is a cross-sectional view illustrating a configuration example of a pixel according to a third embodiment of the present disclosure.

FIG. 9 is a cross-sectional view illustrating a configuration example of a pixel according to the third embodiment of the present disclosure. The imaging element 1 in FIG. 9 is different from the imaging element 1 described with reference to FIG. 4 in including a microlens 154 instead of the microlens 151 and further including a transparent resin layer 162 and an antireflection layer 163.

The microlens 154 is a lens having a refractive index of a value smaller than the refractive index of the microlens 151, for example, 1.9. The microlens 154 can be formed using, for example, an organic material such as resin. Since a resin having a high refractive index is not used, like the microlens 151, the microlens can be relatively easily formed.

The transparent resin layer 162 is a transparent resin layer arranged adjacent to the microlens 154 and having a refractive index different from the refractive index of the microlens 154 by a predetermined difference. Furthermore, a transparent resin layer 161 is a transparent resin layer having a refractive index different from the refractive index of the transparent resin layer 162. The refractive index of the transparent resin layer 161 can be set to 1.5 that is the same as the refractive index of a sealing glass 171, for example.

In the case of using the microlens 154 having the refractive index of 1.9 and adopting the value of 0.5 as the difference in the refractive index from the transparent resin layer, a transparent resin layer having a refractive index of 1.4 or lower needs to be used. However, in the case of arranging the transparent resin layer having the refractive index of 1.4 or lower, the refractive index is different from that of the sealing glass 171. Therefore, reflection of incident light occurs at an interface between the transparent resin layer and the sealing glass 171. Therefore, the transparent resin layer 161 having the same refractive index as the sealing glass 171 is used as the transparent resin layer adjacent to the sealing glass 171, and the transparent resin layer 162 having the refractive index of 1.4 or lower is further arranged. Thereby, the above-described predetermined difference can be secured as the difference in the refractive index between the transparent resin layer and the microlens 154 while preventing the reflection of incident light between the transparent resin layer and the sealing glass 171. Note that the transparent resin layer 162 is an example of a first transparent resin layer described in claims. The transparent resin layer 161 is an example of a second transparent resin layer described in claims.

The antireflection layer 163 is arranged between the transparent resin layers 161 and 162, and reduces reflection of incident light at interfaces between the antireflection layer 163 and each of the transparent resin layers 161 and 162. The antireflection layer 163 is formed to have a thickness of ¼ of a wavelength of the incident light, thereby inverting a phase of reflected light from the interface between the antireflection layer 163 and the transparent resin layer 162 with respect to reflected light from the interface between the antireflection layer 163 and the transparent resin layer 161. Thereby, the reflected light from the interfaces between each of the transparent resin layers 161 and 162 and the antireflection layer 163 is cancelled, and reflection is reduced. Such an antireflection layer 163 can be formed using, for example, $SiO_2$, SiN, and SiON. By further including the antireflection layer 163, reflection of incident light at the interfaces between the antireflection layer 163 and each of the transparent resin layers 161 and 162 can be reduced. Note that the antireflection layer 163 can be omitted.

Description of configurations other than the above-described configuration of the imaging element 1 is omitted as the configurations are similar to those of the imaging element 1 described in the first embodiment of the present disclosure.

As described above, the imaging element 1 according to the third embodiment of the present disclosure has the transparent resin layers 161 and 162 having different refractive indexes. Thereby, the transparent resin layers having the refractive index having the predetermined difference from the microlens 154 can be arranged while preventing reflection between the transparent resin layer and the sealing glass 171, and reflection of incident light can be reduced even in the case of using the microlens 154 having the relatively small refractive index.

4. Fourth Embodiment

The imaging element 1 of the above-described third embodiment has used the antireflection layer 163. In contrast, an imaging element 1 according to a fourth embodiment of the present disclosure is different from the above-described third embodiment in using a microlens including an antireflection film.

[Configuration of Pixel]

Figure 10:
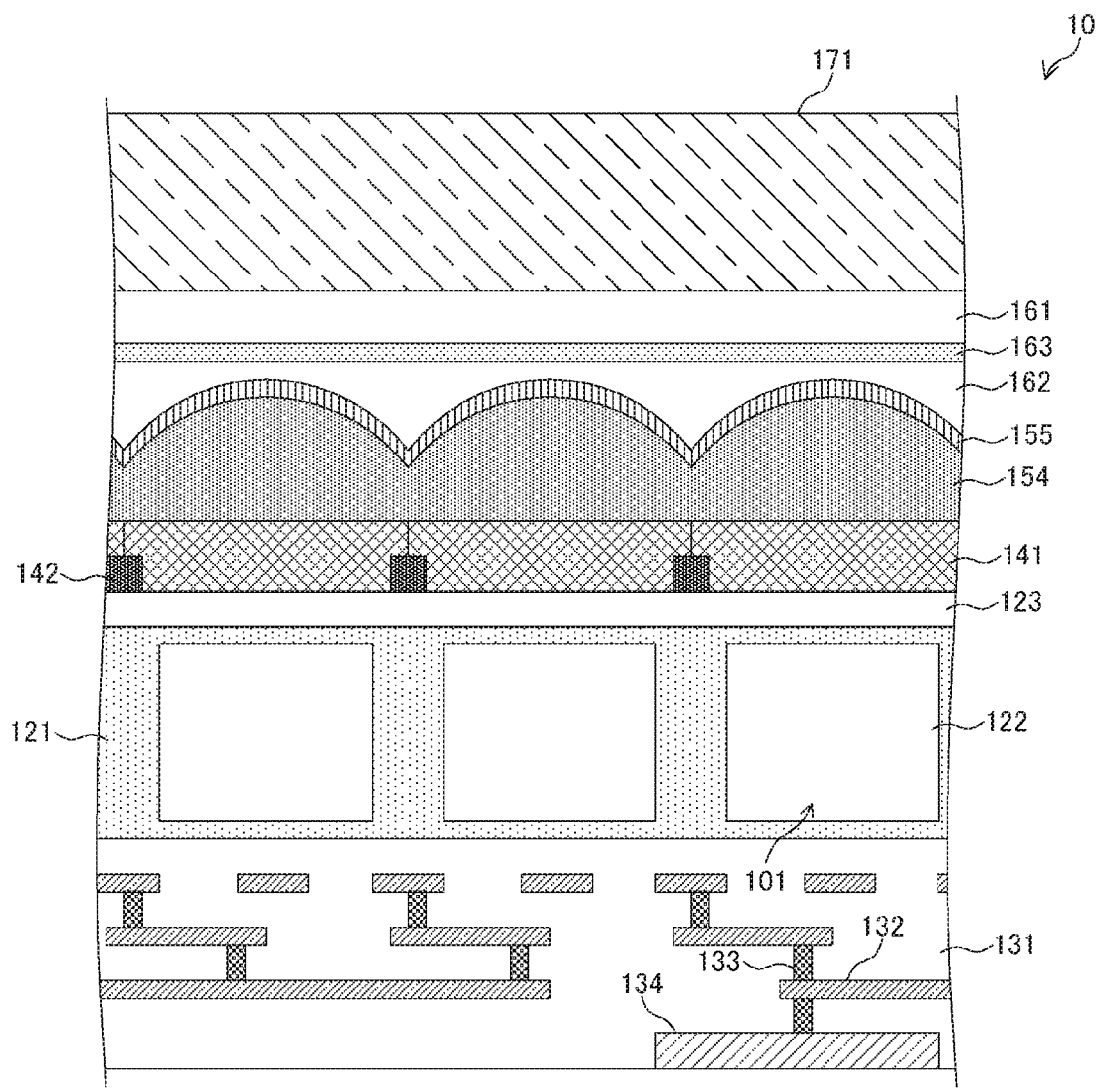
FIG. 10 is a cross-sectional view illustrating a configuration example of a pixel according to a fourth embodiment of the present disclosure.

FIG. 10 is a cross-sectional view illustrating a configuration example of a pixel according to the fourth embodiment of the present disclosure. The imaging element 1 in FIG. 10 is different from the imaging element 1 described with reference to FIG. 9 in further including an antireflection film 155 on a surface of a microlens 154.

The antireflection film 155 is a film formed on the surface of the microlens 154, and reduces reflection of incident light at an interface between the microlens 154 and a transparent resin layer 162. By arranging the antireflection film 155, reflection of incident light in the imaging element 1 can be further reduced.

[Configuration of Antireflection Film]

Figure 11:
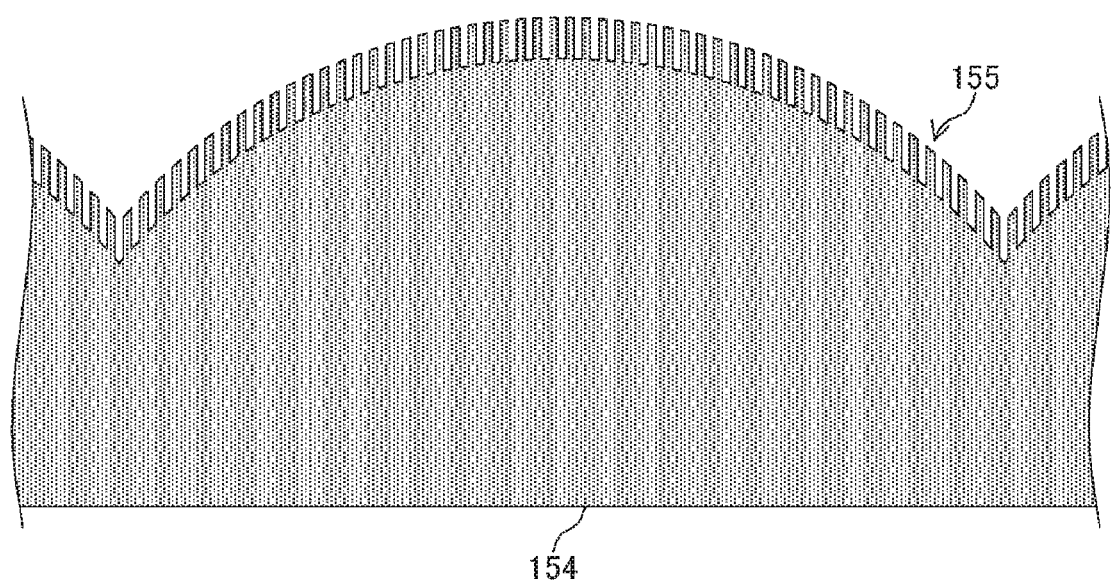
FIG. 11 is a view illustrating a configuration example of an antireflection film according to the fourth embodiment of the present disclosure.

FIG. 11 is a diagram illustrating a configuration example of the antireflection film according to the fourth embodiment of the present disclosure. The antireflection film 155 in FIG. 11 has unevenness formed in the surface of the microlens 154. Such unevenness scatters reflected light and suppresses re-incidence of light on a pixel 100. Such an antireflection film 155 can be formed by, for example, selectively etching metal contained in the microlens 154. Note that the size of the uneven portion of the antireflection film 155 is favorably 150 nm or less. This is because the influence of diffraction on an adjacent pixel 100 can be reduced. Note that the configuration of the antireflection film 155 is not limited to this example. For example, the antireflection film 155 having a similar configuration to the antireflection layer 163 can be used.

Description of configurations other than the above-described configuration of the imaging element 1 is omitted as the configurations are similar to those of the imaging element 1 described in the third embodiment of the present disclosure.

As described above, the imaging element 1 according to the fourth embodiment of the present disclosure uses the microlens 154 including the antireflection film 155, thereby further suppressing reflection of incident light.

5. Fifth Embodiment

The imaging element 1 of the above-described second embodiment has used the lens portion 152 formed using the inorganic material having the refractive index of 2.0 or larger. In contrast, an imaging element 1 according to a fifth embodiment of the present disclosure is different from the above-described second embodiment in using a lens portion formed using an inorganic material having a relatively small refractive index.

[Configuration of Pixel]

Figure 12:
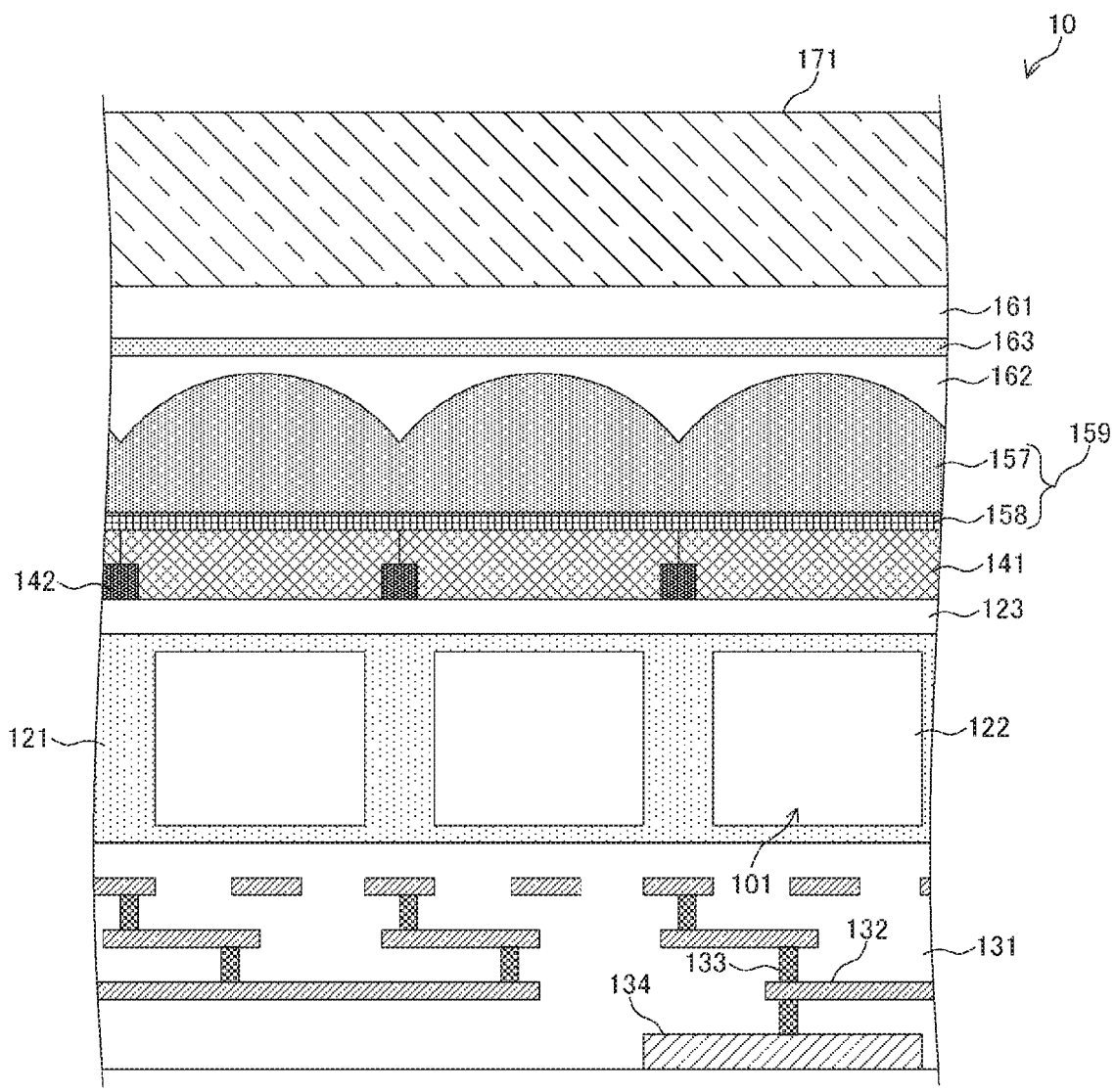
FIG. 12 is a cross-sectional view illustrating a configuration example of a pixel according to a fifth embodiment of the present disclosure.

FIG. 12 is a cross-sectional view illustrating a configuration example of a pixel according to the fifth embodiment of the present disclosure. The imaging element 1 in FIG. 12 is different from the imaging element 1 described with reference to FIG. 8 in using a microlens 159 instead of the microlens 156 and further including a transparent resin layer 162 and an antireflection layer 163 described with reference to FIG. 9.

The microlens 159 in FIG. 12 includes a lens portion 157 and a flattened portion 158. The lens portion 157 is formed using an inorganic material, and the refractive index is set to, for example, 1.9. Furthermore, the flattened portion 158 in FIG. 12 has substantially the same refractive index as the lens portion 157. Description of other configurations of the lens portion 157 and the flattened portion 158 is omitted as the configurations are similar to those of the lens portion 152 and the flattened portion 153 described with reference to FIG. 8.

In the imaging element 1 in FIG. 12, even in the case of using the lens portion 157 formed using the inorganic material having the refractive index of 1.9, a surface of a color filter 141 can be flattened by the flattened portion 158, and a difference in the refractive index between the lens portion 157 and the transparent resin layer 162 can be set to 0.5. That is, a similar effect to the case of using the microlens 151 formed using the organic material having the refractive index of 2.0 described with reference to FIG. 4 can be obtained. Furthermore, by arranging the antireflection layer 163, reflection of incident light at interfaces between the antireflection layer 163 and each of the transparent resin layers 161 and 162 can be reduced.

Description of configurations other than the above-described configuration of the imaging element 1 is omitted as the configurations are similar to those of the imaging element 1 described in the third embodiment of the present disclosure.

As described above, in the imaging element 1 according to the fifth embodiment of the present disclosure, the transparent resin layer 162 and the antireflection layer 163 are arranged. Thereby, reflection at the interfaces between the antireflection layer 163 and each of the transparent resin layers 161 and 162 can be reduced while securing the value of 0.5 as the difference in the refractive index between the transparent resin layer 162 and the lens portion 157 in the case of using the lens portion 157 formed using the inorganic material.

<6. Application to Camera>

The present technology can be applied to various products. For example, the present technology may be implemented as an imaging element mounted on an imaging device such as a camera.

Figure 13:
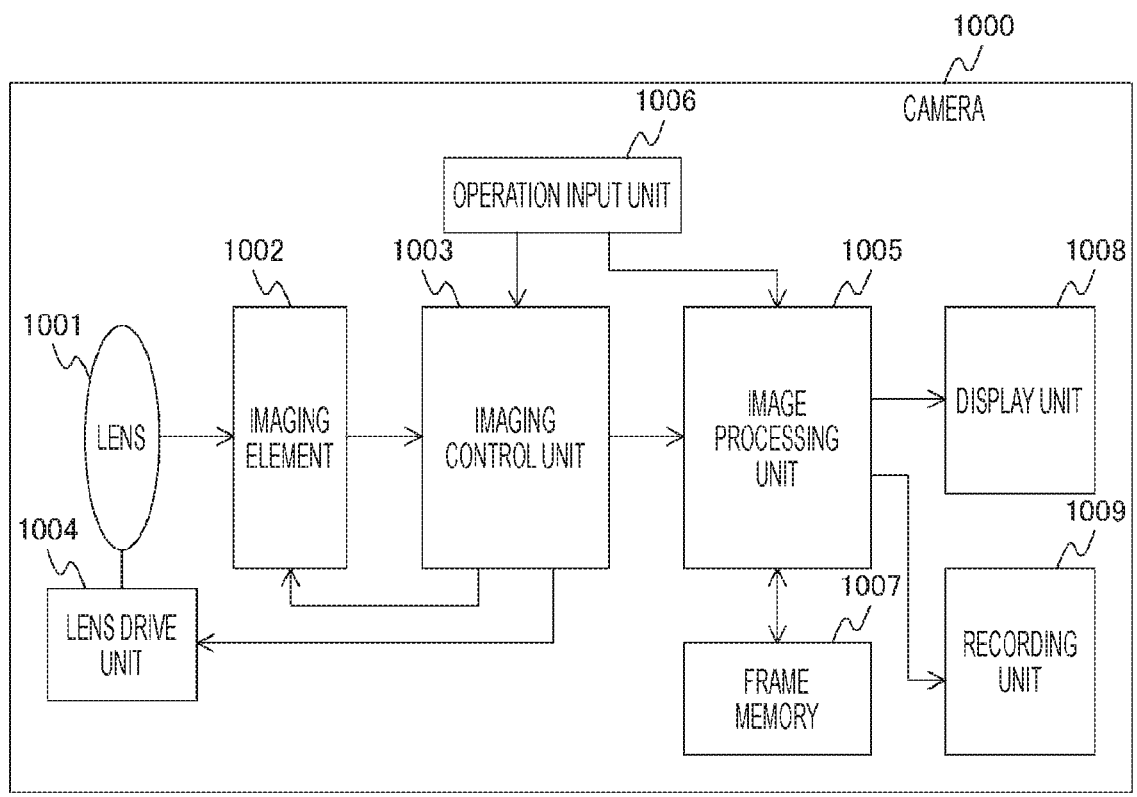
FIG. 13 is a block diagram illustrating a schematic configuration example of a camera as an example of an imaging device to which the present technology is applied.

FIG. 13 is a block diagram illustrating a schematic configuration example of a camera as an example of an imaging device to which the present technology is applied. A camera 1000 in FIG. 13 includes a lens 1001, an imaging element 1002, an imaging control unit 1003, a lens drive unit 1004, an image processing unit 1005, an operation input unit 1006, a frame memory 1007, a display unit 1008, and a recording unit 1009.

The lens 1001 is an imaging lens of the camera 1000. The lens 1001 collects light from an object and causes the collected light to enter the imaging element 1002 to be described below to form an image of the object.

The imaging element 1002 is a semiconductor element that images the light from the object collected by the lens 1001. The imaging element 1002 generates an analog image signal according to the radiated light, and converts the analog image signal into a digital image signal and outputs the digital image signal.

The imaging control unit 1003 controls imaging by the imaging element 1002. The imaging control unit 1003 controls the imaging element 1002 by generating a control signal and outputting the control signal to the imaging element 1002. Furthermore, the imaging control unit 1003 can perform autofocus in the camera 1000 on the basis of the image signal output from the imaging element 1002. Here, the autofocus is a system that detects a focal position of the lens 1001 and automatically adjusts the focal position. As the autofocus, a method of detecting an image plane phase difference using a phase difference pixel arranged in the imaging element 1002 and detecting the focal position (image plane phase difference autofocus) can be used. Furthermore, a method of detecting a position where the contrast of an image becomes the highest as the focal position (contrast autofocus) can be also applied. The imaging control unit 1003 adjusts the position of the lens 1001 via the lens drive unit 1004 on the basis of the detected focal position, and performs autofocus. Note that the imaging control unit 1003 can be formed using, for example, a digital signal processor (DSP) equipped with firmware.

The lens drive unit 1004 drives the lens 1001 on the basis of the control of the imaging control unit 1003. The lens drive unit 1004 can drive the lens 1001 by changing the position of the lens 1001 using a built-in motor.

The image processing unit 1005 processes an image signal generated by the imaging element 1002. This processing corresponds to, for example, demosaicing for generating an image signal of a missing color among image signals corresponding to red, green, and blue for each pixel, noise reduction for removing noise of the image signal, encoding of the image signal, and the like. The image processing unit 1005 can be formed using, for example, a microcomputer equipped with firmware.

The operation input unit 1006 receives an operation input from a user of the camera 1000. As the operation input unit 1006, for example, a push button or a touch panel can be used. The operation input received by the operation input unit 1006 is transmitted to the imaging control unit 1003 and the image processing unit 1005. Thereafter, processing corresponding to the operation input, for example, processing such as imaging of the object is started.

The frame memory 1007 is a memory that stores a frame that is an image signal for one screen. The frame memory 1007 is controlled by the image processing unit 1005, and holds frames in the course of image processing.

The display unit 1008 displays an image processed by the image processing unit 1005. For the display unit 1008, for example, a liquid crystal panel can be used.

The recording unit 1009 records an image processed by the image processing unit 1005. For the recording unit 1009, for example, a memory card or a hard disk can be used.

The camera to which the present invention is applicable has been described. The present technology can be applied to the imaging element 1002 among the above-described configurations. Specifically, the imaging element 1 described with reference to FIG. 1 can be applied to the imaging element 1002. By applying the imaging element 1 to the imaging element 1002, reflection of the incident light can be reduced in the imaging element that adopts a package having a simple configuration. Deterioration of the image quality of the image generated by the camera 1000 can be prevented.

Note that, although the camera has been described as an example here, the technology according to the present invention may be applied to, for example, a monitoring device or the like.

Lastly, the description of each of the above embodiments is an example of the present disclosure, and the present disclosure is not limited to the above-described embodiments. Therefore, it goes without saying that various changes can be made according to design and the like even if the changes are other than the above-described embodiments as long as the changes do not depart from the technical idea according to the present disclosure.

Note that the present disclosure can also have the following configurations.

(1) An imaging element including:
a pixel formed on a semiconductor substrate, and configured to generate an image signal according to radiated light;
a microlens arranged adjacent to the pixel, and configured to collect incident light, irradiate the pixel with the incident light, and flatten a surface of the pixel;
a transparent resin layer arranged adjacent to the microlens, and having a refractive index different from a refractive index of the microlens by a predetermined difference; and
a sealing glass arranged adjacent to the transparent resin and sealing the semiconductor substrate.

(2) The imaging element according to (1), in which the transparent resin layer has the refractive index having the predetermined difference of 0.4 to 0.6.

(3) The imaging element according to (1) or (2), in which the transparent resin layer includes a first transparent resin layer arranged adjacent to the microlens and having the refractive index different from the refractive index of the microlens by the predetermined difference, and a second transparent resin layer having the refractive index different from the first transparent resin layer.

(4) The imaging element according to (3), in which the transparent resin layer includes an antireflection layer between the first transparent resin layer and the second transparent resin layer.

(5) The imaging element according to any one of (1) to (4), in which the microlens is formed using an organic material.

(6) The imaging element according to any one of (1) to (4), in which the microlens includes a lens portion formed using an inorganic material, and a flattened portion having substantially the same refractive index as the lens portion and arranged adjacent to the pixel.

(7) The imaging element according to any one of (1) to (6), in which the microlens includes an antireflection film.

(8) The imaging element according to (7), in which the microlens includes a region that is an uneven surface of the microlens as the antireflection film.

(9) The imaging element according to any one of (1) to (8), further including:
an imaging lens arranged adjacent to a surface of the sealing glass, the surface being different from a surface of the sealing glass where the transparent resin layer is arranged.

(10) A method of manufacturing an imaging element, the method including:
a pixel forming process of forming a pixel on a semiconductor substrate, the pixel being configured to generate an image signal according to radiated light;
a microlens arranging process of arranging a microlens adjacent to the formed pixel, the microlens collecting incident light to irradiate the pixel with the incident light, and flattening a surface of the pixel;
a transparent resin layer arranging process of arranging a transparent resin layer adjacent to the arranged microlens, the transparent resin layer having a refractive index different from a refractive index of the microlens by a predetermined difference; and
a sealing process of arranging a sealing glass adjacent to the arranged transparent resin layer, the sealing glass sealing the semiconductor substrate.

REFERENCE SIGNS LIST

1 Imaging element
10 Pixel array unit 12, 22 Semiconductor substrate
13, 23 Wiring region
20 Signal processing chip
100 Pixel
123 Insulating film
141 Color filter
142 Light-shielding film
151, 154, 156, 159 Microlens
152, 157 Lens portion
153, 158 Flattened portion
155 Antireflection film
161, 162 Transparent resin layer
163 Antireflection layer
171 Sealing glass
181 Imaging lens
1002 Imaging element

The invention claimed is:

1. An imaging element, comprising:
a pixel on a semiconductor substrate;
a microlens adjacent to the pixel, wherein
the microlens is configured to:
collect incident light,
radiate the incident light on the pixel, and
flatten a surface of the pixel, and
the pixel is configured to generate an image signal based on the incident light radiated on the pixel;
a first transparent resin layer adjacent to the microlens, wherein the first transparent resin layer has a refractive index different from a refractive index of the microlens by a difference of 0.4 to 0.6;
a first antireflection film;
a second antireflection film on a surface of the microlens, wherein the first transparent resin layer is between the first antireflection film and the second antireflection film; and
a sealing glass adjacent to the first transparent resin layer, wherein the sealing glass seals the semiconductor substrate.

2. The imaging element according to claim 1, further comprising a second transparent resin layer having a refractive index different from the refractive index of the first transparent resin layer, wherein the second transparent resin layer is between the sealing glass and the first antireflection film.

3. The imaging element according to claim 2, wherein the first antireflection film is between the first transparent resin layer and the second transparent resin layer.

4. The imaging element according to claim 1, wherein the microlens includes an organic material.

5. The imaging element according to claim 1, wherein the microlens includes:
a lens portion that includes an inorganic material; and
a flattened portion having substantially a same refractive index as the lens portion, wherein the flattened portion is adjacent to the pixel.

6. The imaging element according to claim 1, wherein the microlens includes, as the second antireflection film, a region that is an uneven surface of the microlens.

7. The imaging element according to claim 1, further comprising:
an imaging lens on a first surface of the sealing glass; and
a second transparent resin layer on a second surface of the sealing glass.

8. A method of manufacturing an imaging element, the method comprising:
forming a pixel on a semiconductor substrate;
a microlens adjacent to the pixel, wherein
the microlens is configured to:
collect incident light,
radiate the incident light on the pixel, and
flatten a surface of the pixel, and
the pixel is configured to generate an image signal based on the incident light radiated on the pixel;
arranging a transparent resin layer adjacent to the microlens,
wherein the transparent resin layer has a refractive index different from a refractive index of the microlens by a difference of 0.4 to 0.6;
arranging a first antireflection film adjacent to the transparent resin layer;
arranging a second antireflection film on a surface of the microlens,
wherein the transparent resin layer is between the first antireflection film and the second antireflection film; and
arranging a sealing glass adjacent to the transparent resin layer, wherein the sealing glass seals the semiconductor substrate.

* * * * *